United States Patent [19]
Masumura et al.

[11] Patent Number: 5,827,779
[45] Date of Patent: Oct. 27, 1998

[54] METHOD OF MANUFACTURING SEMICONDUCTOR MIRROR WAFERS

[75] Inventors: Hisashi Masumura; Kiyoshi Suzuki; Hideo Kudo, all of Fukushima-ken, Japan

[73] Assignee: Shin-Etsu Handotai Co. Ltd., Shiyoda-ku, Japan

[21] Appl. No.: 684,000

[22] Filed: Jul. 19, 1996

[30] Foreign Application Priority Data

Jul. 21, 1995 [JP] Japan ..................................... 7-207514
Jul. 15, 1996 [JP] Japan ..................................... 8-204311

[51] Int. Cl.⁶ ................................................. H01L 21/44
[52] U.S. Cl. .......................................... 438/691; 438/692
[58] Field of Search ..................................... 437/225, 226; 438/464, 476, 692, 624, 631, 635, 609, 691

[56] References Cited

U.S. PATENT DOCUMENTS 5,618,227  4/1997  Tsutsumi et al. ........................ 451/288
5,643,405  7/1997  Bello et al. ........................... 156/636.1

FOREIGN PATENT DOCUMENTS

A 0 588 055  3/1994  European Pat. Off. .

OTHER PUBLICATIONS

Extended Abstracts, vol. 77, No. 34, May 1977, Princeton, N.J. pp. 452–453, E.L. Kern et al.

Applied Optics, vol. 33, No. 34, Dec. 1, 1994, Washington D.C., pp. 7945–7954, Haisma et al., "Improved Geometry of Double Sided . . .".

IBM Technical Disclosure Bulletin, vol. 25, No. 9, Feb, 1, 1983, p. 4761, E. Mendel et al., "Reduction of Grinding and Lapping Defects".

*Primary Examiner*—Charles L. Bowers, Jr.
*Assistant Examiner*—ReneéR. Berry
*Attorney, Agent, or Firm*—Armstrong, Westerman, Hattori, McLeland & Naughton

[57] ABSTRACT

A method of manufacturing semiconductor mirror wafers includes a double side primary mirror polishing step and a single side final mirror polishing step. The method having the double side mirror polishing step is capable of higher flatness level wafer processing, suppression of fine dust or particles, thereby to increase the yield of semiconductor devices, higher productivity due to simplification of processes, higher quality processing with lower manufacturing cost than conventional methods.

8 Claims, 8 Drawing Sheets

POSITION ON WAFER SURFACE (μm)

POSITION ON WAFER SURFACE (μm)

METHOD OF MANUFACTURING SEMICONDUCTOR MIRROR WAFERS

BACKGROUND OF THE INVENTION

1. Field of the Invention

The present invention relates to a method of manufacturing semiconductor mirror wafers, in particular, single-crystal silicon mirror wafers (hereinafter may be referred to, for brevity, as "mirror wafer") which become substrates for fabricating semiconductor devices.

2. Description of the Related Art

Generally, as shown in FIG. 11, the manufacturing method of semiconductor wafers includes a slicing step (A) to obtain wafers of thin disc shape by slicing a single crystal ingot formed by a pulling step using a crystal pulling machine; a chamfering step (B) to chamfer a peripheral edge portion of the wafer obtained through the slicing step (A) to prevent cracking or breakage of the wafer; a lapping step (C) to flatten the surface of the chamfered wafer by lapping it; an etching step (D) to remove processing deformation of the so chamfered and lapped wafer; a primary mirror polishing process (E1) to primarily polish one side of the etched wafer to obtain a primary mirror surface of the wafer; a final mirror polishing step (F) to finally polish the side of the so primarily mirror polished wafer to obtain a final mirror surface of the wafer; and a cleaning step (G) for cleaning the finally mirror polished wafer to remove the polishing agent or dust particles from its surface.

The above conventional method of manufacturing semiconductor wafers has problems such as complexity of processes and higher manufacturing cost.

As the etching step (D), there are two types of steps, that is, an acid etching step using an acid etching solution of a mixed acid or the like and an alkaline etching step using an alkaline etching solution of NaOH or the like. In the acid etching step, as shown in FIG. 12, a relatively high etching rate is obtained, and surface roughness of an etched wafer is so fine that a cycle of the roughness is less than 10 $\mu$m in frequency and a P-V (Peak to Valley) value thereof is smaller than 0.6 $\mu$m. On the contrary, in the alkaline etching step, as shown in FIG. 13, surface roughness of an etched wafer is so large that a cycle of the roughness is in the range of 10 to 20 $\mu$m in frequency and a P-V value thereof sometimes exceeds 1.5 $\mu$m.

However, in the semiconductor wafer produced through the respective steps shown in FIG. 11, the following problem has been seen because the back side of the etched wafer is left as etched to the final stage.

After both the sides of the wafer are etched in the etching step, only the front side of the wafer is subjected to mirror polishing in the next mirror polishing step. The polished front side of the wafer is not chucked by as a vacuum chucking means and therefore offers no problem. However, when the back side of the etched wafer is chucked by such a chucking means, etched portions still remaining in the back side with relatively large surface roughness are chipped or broken to generate fine dust or a great number of fine particles, due to which the yield of semiconductor devices being degraded.

In case that a degree of integration of semiconductor devices is increased in the future, the generation of fine dust or particle from the back side of the wafer described above will become a big problem and hence mirror polishing of the back side of the wafer will be required. Higher flatness level of the wafer will be required more strictly than the present level.

If the wafer is subjected to double side polishing, both the front and back sides of the wafer can be mirror polished simultaneously with high flatness level.

SUMMARY OF THE INVENTION

With the foregoing problems in view, the present inventors conducted extended researches to realize a novel method of manufacturing semiconductor mirror wafers including a double side polishing step with high flatness level and low manufacturing cost. The researches lead to the result that the present invention is accomplished.

It is an object of the present invention to provide a novel method of manufacturing semiconductor mirror wafers which is capable of higher flatness level wafer processing, suppression of fine dust or particles generated by chipping of the back side of the wafer, thereby to increase the yield of semiconductor devices, higher productivity due to simplification of processes, higher quality processing with lower manufacturing cost than conventional methods.

To attain the foregoing object, in one aspect, the present invention provides a method of manufacturing semiconductor mirror wafers which comprises the steps of: forming wafers of thin disc shape by slicing a single crystal ingot; chamfering a peripheral edge portion of the sliced wafer; double side primary mirror polishing of both the front and back sides of the chamfered wafer; and single side final mirror polishing of the front side of the double side primary mirror polished wafer.

In another aspect, the present invention provides a method of manufacturing semiconductor mirror wafers which comprises the steps of: forming wafers of thin disc shape by slicing a single crystal ingot; chamfering a peripheral edge portion of the sliced wafer; double side primary mirror polishing of both the front and back sides of the chamfered wafer; single side secondary mirror polishing of the front side of the double side primary mirror polished wafer; and single side final mirror polishing of the front side of the single side secondary mirror polished wafer.

The polishing stock removal in the double side primary mirror polishing step is preferably at least 60 $\mu$m, more preferably at least 80 $\mu$m.

A flatness level of a sliced wafer obtained in a conventional slicing step is 10–20 $\mu$m in TTV (Total Thickness Variation, that is, a difference between maximum thickness and minimum thickness on the whole surface of the wafer) and moreover the sliced wafer has a processing damage to the depth in a single side of maximum 30 $\mu$m. The slicing step affords a wafer a deformation called "undulations (waviness)" appearing as surface irregularities having a periodicity of several millimeters to several tens millimeters. The inventors, however, found the fact that double side polishing of the sliced and chamfered wafer with a hard polishing pad having a hardness of at least 80 (Asker C-scale) can afford the wafer extremely excellent flatness with the polishing stock removal in a single side being at least 30 $\mu$m, and can remove a deformed layer and surface irregularities caused by the slicing.

In the conventional wafer manufacturing method, a lapping step is carried out in order to remove the process damage and to improve the very bad flatness (TTV) of the wafer introduced in the slicing step. The conventional lapping step, however, can not remove the undulations of the wafer. The lapping step also affords a damage of several micrometers. The etching step is used for removing the damage of the wafer.

The inventors found by extended researches that the double side polishing can remove the process damage and to improve the very bad flatness (TTV) of the wafer introduced in the slicing step, and surprisingly the undulations of the wafer. The present invention was accomplished on the basis of the findings. As the double side polishing affords the wafer few damages, the etching step is not required as a matter of course. Both sides of the wafer are mirror polished and hence fine dust or particles generated by chipping of the back side of the wafer can be suppressed.

The above and other objects, features and advantages of the present invention will become manifest to those versed in the art upon making reference to the detailed description and the accompanying sheets of drawings.

DETAILED DESCRIPTION

Figure 1:
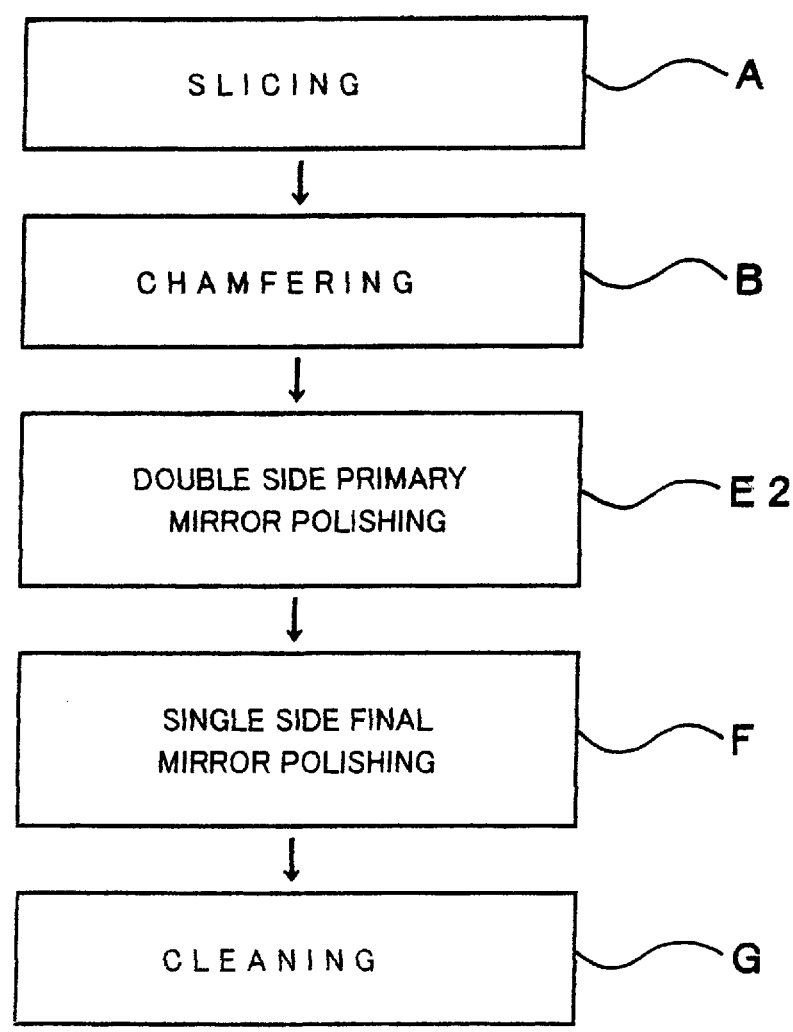
FIG. 1 is a flow chart showing an embodiment of the present invention.
Figure 10:
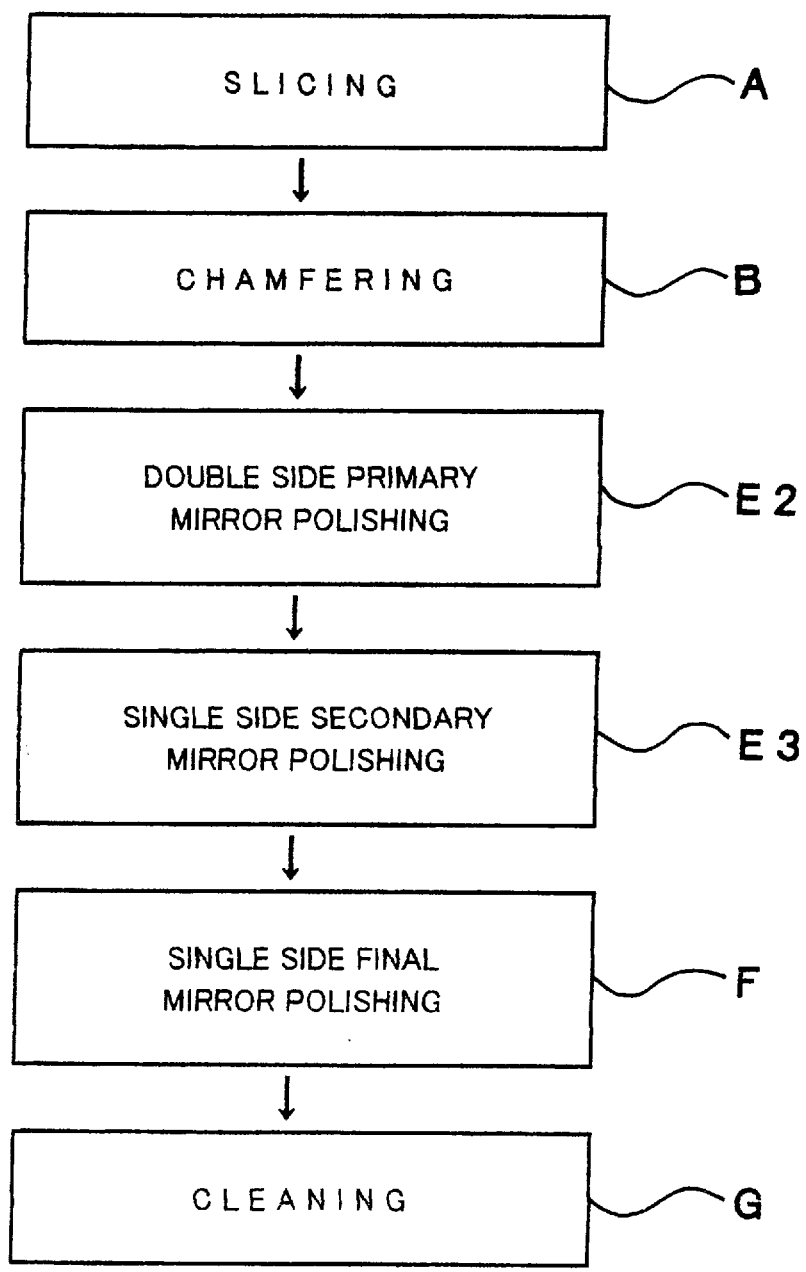
FIG. 10 is a flow chart showing another embodiment of the present invention.

The present invention will be described below in greater detail by way of the following examples which should be construed as illustrative rather than restrictive. In FIGS. 1 and 10, those steps which are like or corresponding to those shown in FIG. 11 are designated by the corresponding reference characters.

FIG. 1 is a flow chart showing an embodiment of the present invention. In a slicing step (A), a single crystal ingot, formed by a pulling step using a crystal pulling machine, is sliced at a right angle, or predetermined angle, to an axial direction thereof to produce a plurality of wafers of thin disc shape. A peripheral edge portion of the wafer obtained through the slicing step (A) is chamfered in a chamfering step (B) to prevent cracking or breakage of the wafer.

Figure 11:
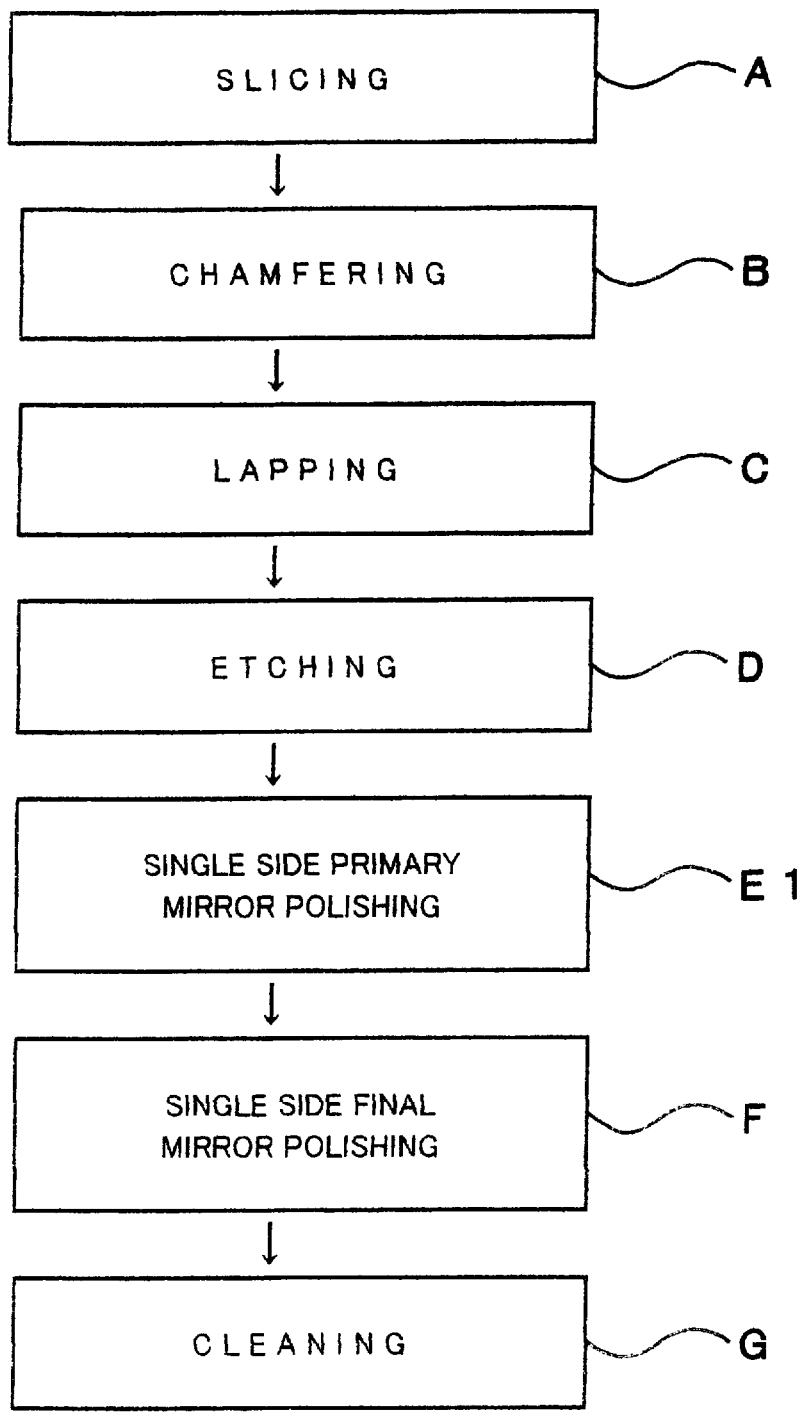
FIG. 11 is a flow chart showing one example of conventional manufacturing methods of semiconductor wafers.
Figure 12:
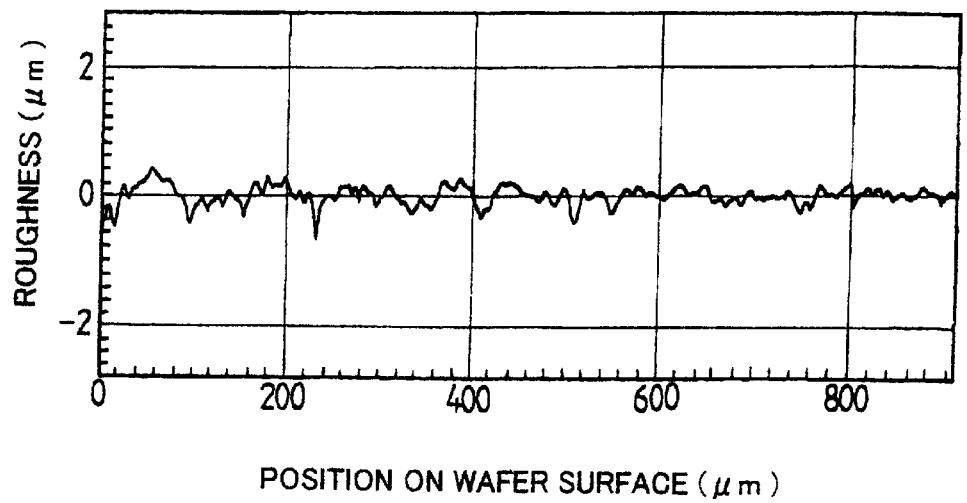
FIG. 12 is a graph showing distribution of the surface roughness of a wafer subjected to acid etching.
Figure 13:
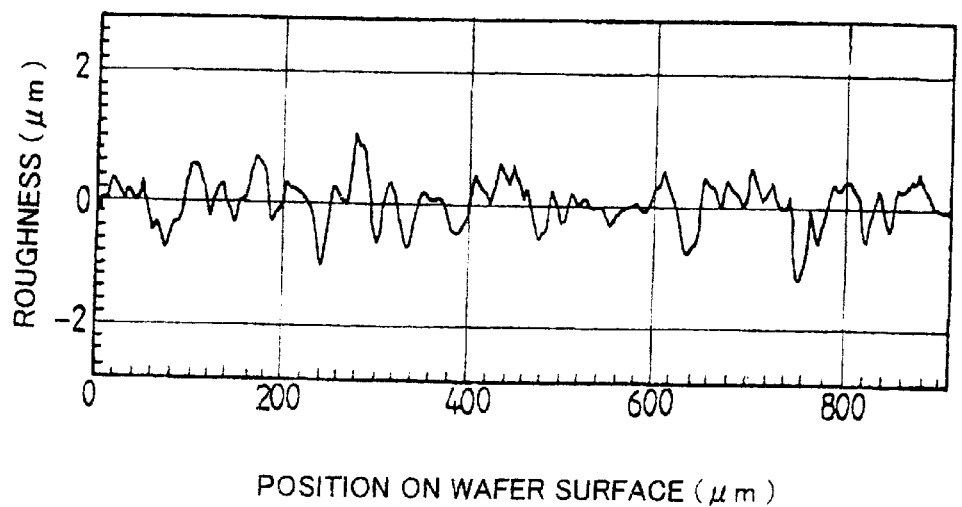
FIG. 13 is a graph showing distribution of the surface roughness of a wafer subjected to alkaline etching.

By the way, as shown in FIG. 11, in the conventional method, the wafer chamfered in the chamfering step (B) is subjected to a lapping step (C), an etching step (D), a single side primary mirror polishing step (E1) and thereafter a single side final mirror polishing step (F). The wafer, which was etched to remove the processing damage, is subjected to the single side primary mirror polishing step (E1) and the single side final mirror polishing step (F) so as to mirror polish one side (front side) thereof only. Surface roughness is generated on both sides of the wafer through the etching step. The surface roughness on the front side is removed by the above two mirror polishing steps (E1) and (F) but the surface roughness on the back side is left, as etched, to the final stage. Due to the surface roughness, the above noted problem has been seen.

Figure 9:
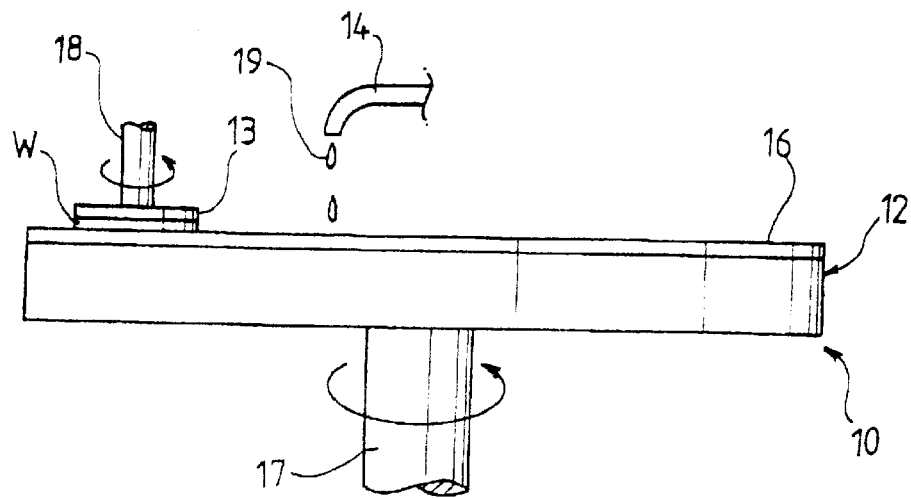
FIG. 9 is a schematic side view showing a single side polishing machine.

With the problem in view, in an embodiment of the present invention, as shown in FIG. 9, after the chamfering step (B), the lapping step (C), the etching step (D) and the single side primary mirror polishing step (El) are not carried out. Instead of these steps, a double side primary mirror polishing step (E2) is newly carried out. In the double side primary mirror polishing step (E2), the chamfered wafer is primary mirror polished in terms of both sides thereof using a double side polishing machine and a polishing agent described later.

The wafer which was primary mirror polished in terms of both sides thereof is subjected to a single side final mirror polishing step (F) wherein one side (front side) thereof is mirror polished to become a mirror wafer using a usual single side polishing machine 10 and a polishing agent 19 as shown in FIG. 9. The mirror wafer is then subjected to a cleaning step (C) wherein the wafer is cleaned so as to remove the polishing agent or dust particles from its surface.

There can be suppressed the generation of dust from the back side of the mirror wafer which is left as primary mirror polished. For example, when the back side of the wafer is chucked in a photolithograpy process of a device manufacturing line, the generation of dust by chipping can be suppressed and thereby the yield of semiconductor devices can be increased.

Figure 2:
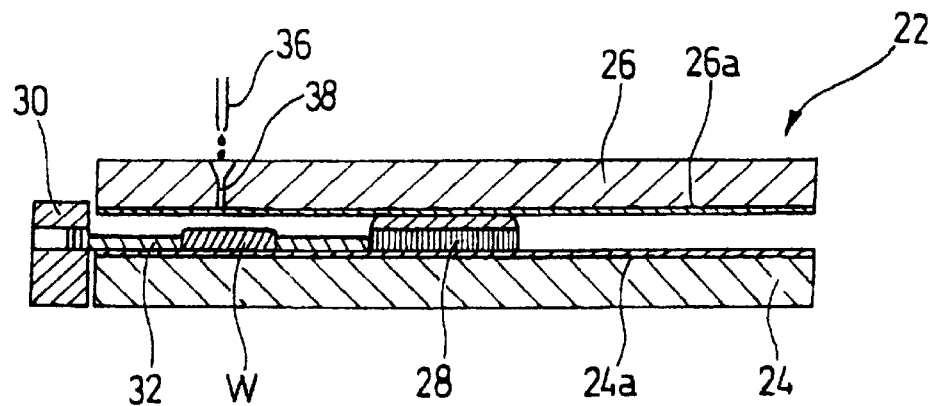
FIG. 2 is a cross sectional schematic view of a double side polishing machine.
Figure 3:
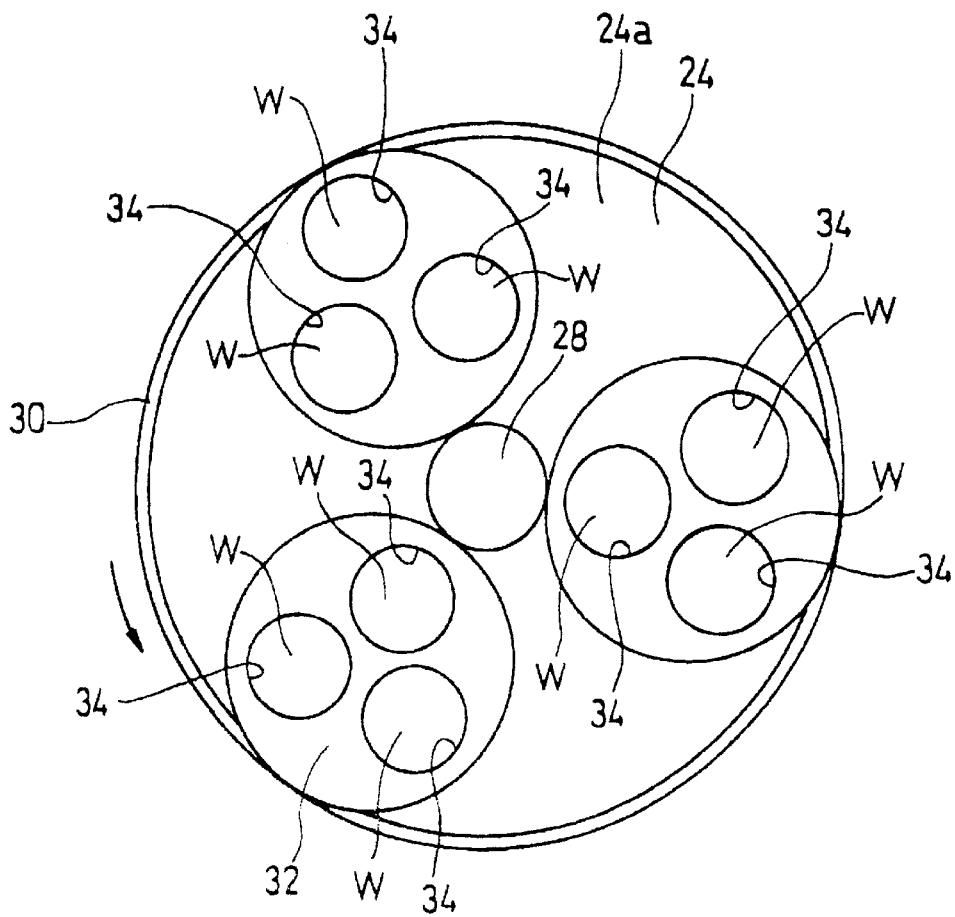
FIG. 3 is a schematic plan view showing a double side polishing machine in which an upper polishing plate is removed.

FIG. 2 is a cross sectional schematic view of a double side polishing machine and FIG. 3 is a schematic plan view showing a double side polishing machine in which an upper polishing plate is removed. In FIG. 2, the double side polishing machine 22 comprises a lower polishing plate 24 and an upper polishing plate 26 which face each other vertically. A lower polishing pad 24a is adhered on the upper surface of the lower polishing plate 24 and an upper polishing pad 26a is adhered on the lower surface of the upper polishing plate 26. The lower polishing plate 24 and the upper polishing plate 26 are rotated oppositely with respect to each other by a driving means (not shown). The lower polishing plate 24 has a central gear 28 which is provided on the upper surface of the central portion thereof and an annular internal gear 30 which is provided in the proximity of the periphery thereof. Both the central gear 28 and the annular internal gear 30 are rotated independently of lower polishing plate 24.

Reference numeral 32 denotes a carrier of a disc type which is supported between the upper surface of the lower polishing pad 24a of the lower polishing plate 24 and the lower surface of the upper polishing pad 26a of the upper polishing plate 26 and rotates and revolves slidably between the lower polishing pad 24a and the upper polishing pad 26a under the action of the central gear 28 and the internal gear 30.

The carrier 32 has a plurality of wafer holes 34. Wafers (W) which are to be polished are set in the wafer holes 34.

When the wafers (W) are polished, a polishing agent is supplied to spaces between the wafers (W) and the polishing pads 24a, 26a via a hole 38 formed in the upper polishing plate 26 from a nozzle 36. As the carrier 32 rotates and revolves, the wafers (W) rotate and revolve slidably between the lower polishing pad 24a and the upper polishing pad 26a, thereby polishing both the sides of the wafers (W).

FIG. 9 is a side elevation showing a conventional single side polishing machine. In FIG. 9, the polishing machine 10 comprises a turn table assembly 12, a wafer holder 13, and a polishing agent supplying member 14. The turn table assembly 12 comprises a turn table 15 and a polishing pad 16 adhered on the upper surface of the turn table 15. The turn table 15 can rotate on a shaft 17 at a predetermined rotation speed by a driving device such as a motor. The wafer holder, 13 is for holding with a vacuum chucking means or like means, the wafer (W) on the polishing pad 16 of the turn table assembly 12 so that the surface of the wafer (W) faces the polishing pad 16. The wafer holder 13 can rotate on a shaft 18 at a predetermined rotation speed and horizontally move on the polishing pad 16 by an appropriate driving device such as a motor. During operation of the polishing machine 10, the wafer (W) held by the wafer holder 13 is in contact with the polishing pad 16 and proper polishing loads are applied to the wafer (W) in a downward direction through the shaft 18 and the wafer holder 13. The polishing agent supplying member 14 is for supplying a polishing agent 19 on the polishing pad 16 to supply it between the wafer (W) and the polishing pad 16.

EXPERIMENT 1

Condition

Sample wafers: Czochralski-grown p-type, 21 100>-oriented, 150-mm-diameter, sliced silicon wafer Polishing pad: Polyurethane foam, hardness=60 or 80 (Asker C-scale)

Polishing agent: 10.0 vol % of AJ-1325 ($SiO_2$ 2 wt %, pH 11, trade name for a colloidal silica polishing agent manufactured by Nissan Chemical Industries, Ltd.) and pure water (the rest)

Polishing load: 100 g/cm$^2$

Under the condition specified above, using the double side polishing machine shown in FIGS. 2 and 3, both the sides of each sample wafer which is a sliced and chamfered wafer were polished to measure the relationship between the polishing stock removal and the flatness (TTV) thereof. The results of the measurement are shown in FIG. 4.

Figure 4:
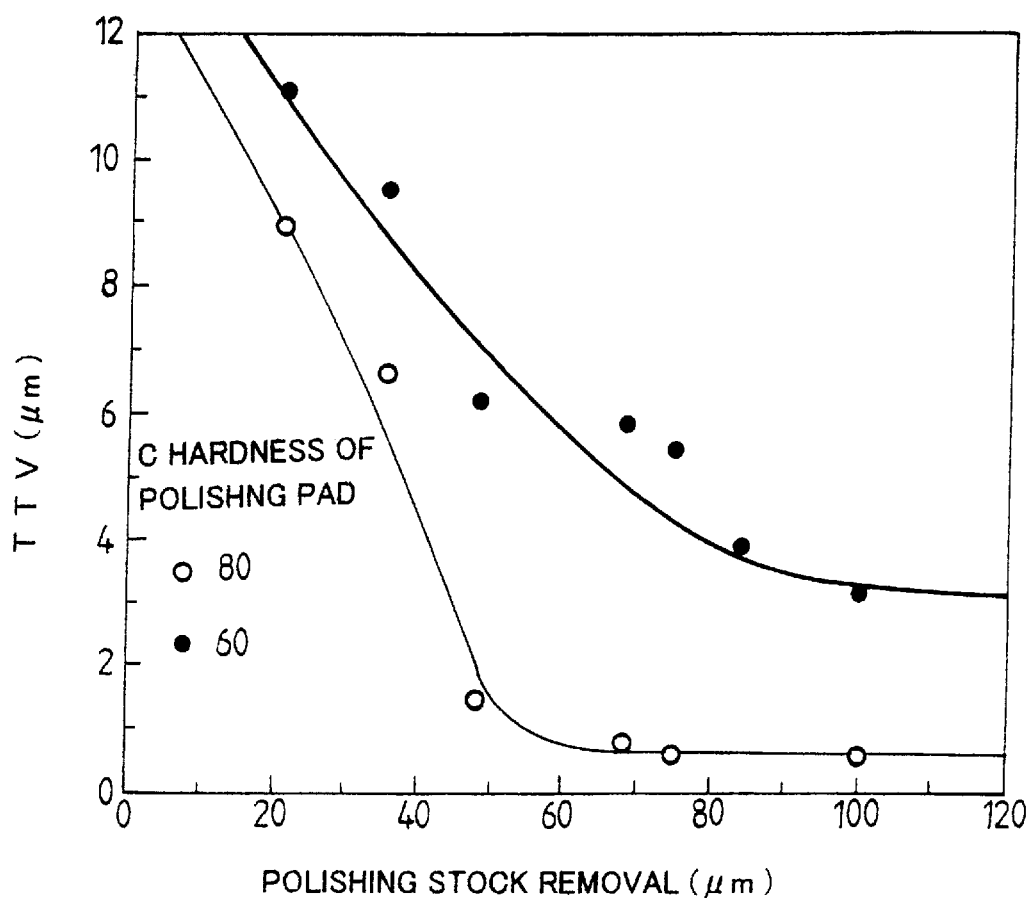
FIG. 4 is a graph showing the relationship between the polishing stock removal and the flatness (TTV) according to Experiment 1.

As is apparent from the results of FIG. 4, the polished wafer surfaces obtained by using the polishing pad having hardness of 80 (Asker C-scale) reached to the flatness (TTV) of at most 1 μm with the polishing stock removal of at least 60 μm. The polished wafer surfaces obtained by using the polishing pad having hardness of 60 (Asker C-scale) reached to the flatness (TTV) of at most 4 μm with the polishing stock removal of at least 80 μm.

Figure 5:
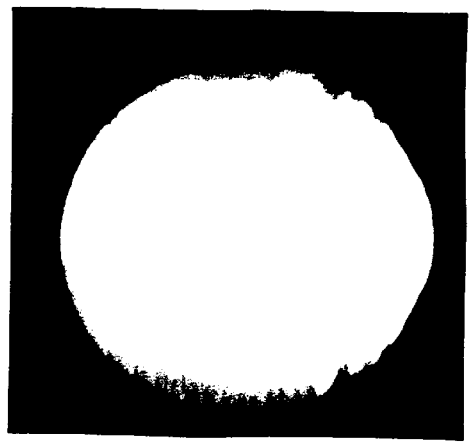
FIG. 5 is a photograph showing patterns of undulations formed on the wafer surface according to Polishing Example 1.
Figure 6:
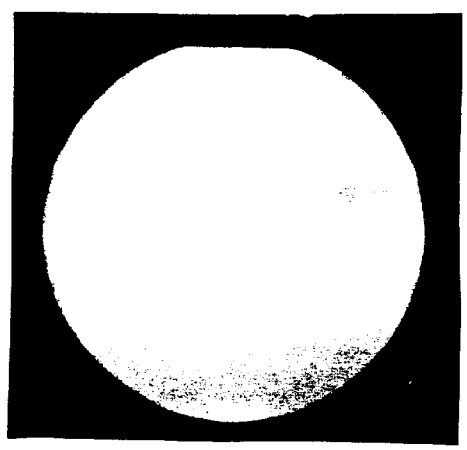
FIG. 6 is a photograph showing patterns of undulations formed on the wafer surface according to Polishing Example 2.
Figure 7:
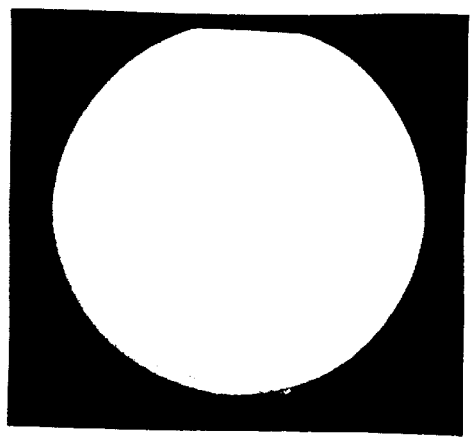
FIG. 7 is a photograph showing patterns of undulations formed on the wafer surface according to Polishing Example 3.

Photographs which show the results of the observation of the undulations on the surface of the polished sample wafers obtained according to the following three Polishing Examples which belong to above Experiment 1. These photographs are topographic images of undulations of the surface of the wafers obtained by an surface topography observation equipment which is based on the principle of magic mirror and enables to detect minute irregularities of the surface of a wafer. In Polishing Example 1, both sides of each sample wafer were polished to the polishing stock removal of 30 μm using the polishing pad having hardness of 80 (Asker C-scale). The photograph of the wafer surface obtained according to the Polishing Example 1 is shown in FIG. 5. In Polishing Example 2, both sides of each sample wafer were polished to the polishing stock removal of 100 μm using the polishing pad having hardness of 60 (Asker C-scale). The photograph of the wafer surface obtained according to the Polishing Example 2 is shown in FIG. 6. In Polishing Example 3, both sides of each sample wafer were polished to the polishing stock removal of 60 μm using the polishing pad having hardness of 80 (Asker C-scale). The photograph of the wafer surface obtained according to the Polishing Example 3 is shown in FIG. 7. As is apparent from FIGS. 5~7, in the Polishing Examples 1 and 2, undulations on the wafer surfaces have been observed, but in the Polishing Example 3, undulations on the wafer surface have disappeared. The results shown in FIGS. 4 to 7 are those only after double side polishing. However, it is confirmed that TTV or surface undulations do not show significant change after single side final mirror polishing of which the polishing stock removal is usually in the range between 0.5 and 2.0 μm because the final mirror polishing is carried out to remove the polishing damage and to improve the surface roughness in the frequency of nanometer order.

Figure 8:
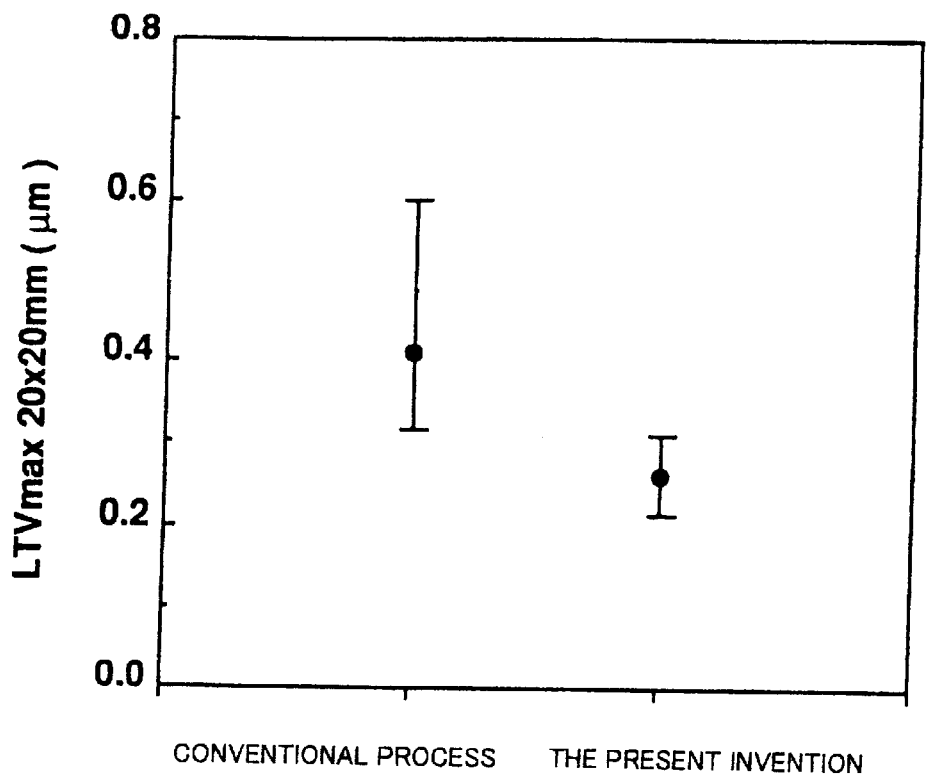
FIG. 8 is a graph showing results of the measurement on the flatness (LTVmax) of wafers manufactured by the present invention and the conventional method.

20 pieces of mirror wafers were manufactured according to the process of the present invention shown in FIG. 1 with the double side polishing step defined in the above Experiment 1 using the polishing pad having hardness of 80 (Asker C-scale) and with the polishing stock removal of the single side final polishing being 1 μm. The flatness (LTVmax: LOCAL THICKNESS VARIATION max) of the manufactured mirror wafers was measured. LTVmax is measured as follows: The wafer surface is divided to a multiplicity of square portions of 20 mm×20 mm and in each square portion the difference between the maximum thickness and the minimum thickness is measured and the maximum value of the differences measured on every square portion is indicated as LTVmax. The results of the measurement are shown in FIG. 8. The mirror wafers were also manufactured according to the conventional process shown in FIG. 11. The flatness (LTVmax) of the conventionally manufactured mirror wafers was measured. The results of the measurement are shown in FIG. 8 together with the above measurement.

The flatness (LTVmax) of the wafers manufactured by the conventional process has an average value of 0.4 μm, a maximum value of 0.6 μm and a minimum value of 0.3 μm. The flatness (LTVmax) of the wafers manufactured by the process of the present invention has an average value of 0.3 μm, a maximum value of 0.4 μm and a minimum value of 0.25 μm. The flatness (LTVmax) attained by the present invention is improved considerably in terms of the above three values.

In the embodiment described above, the single side polishing is carried out in one step of the single side final mirror polishing step (F) alone as shown in FIG. 1. The process of the present invention may be carried out in two steps of a single side secondary mirror polishing step (E3) and the single side polishing step (F) as shown in FIG. 11.

As stated above, the present invention is capable of manufacturing mirror wafers with higher flatness level, suppression of fine dust or particles generated by chipping of the back side of the wafer, thereby to increase the yield of semiconductor devices, higher productivity due to simplification of processes, higher quality processing with lower manufacturing cost than the conventional methods.

Obviously, various minor changes and modifications of the present invention are possible in the light of the above teaching. It is therefore to be understood that within the scope of the appended claims the invention may be practiced otherwise than as specifically described.

What is claimed is:

1. A method of manufacturing semiconductor mirror wafers which comprises the steps of:
   (a) forming wafers of thin disc shape by slicing a single crystal ingot;
   (b) chamfering a peripheral edge portion of the sliced wafer;
   (c) double side primary mirror polishing of both the front and back sides of the chamfered wafer without preparation by lapping or etching prior to polishing; and
   (d) single side final mirror polishing of the front side of the double side polished wafer.

2. A method of manufacturing semiconductor mirror wafers which comprises the steps of:
   (a) forming wafers of thin disc shape by slicing a single crystal ingot;
   (b) chamfering a peripheral edge portion of the sliced wafer;
   (c) double side primary mirror polishing of both the front and back sides of the chamfered wafer without preparation by lapping or etching prior to polishing;
   (d) single side secondary mirror polishing of the front side of the double side primary mirror polished wafer; and
   (e) single side final mirror polishing of the front side of the single side secondary mirror polished wafer.

3. A method of manufacturing semiconductor mirror wafers according to claim 1, wherein a polishing stock removal in the double side primary mirror polishing is at least 60 $\mu$m.

4. A method of manufacturing semiconductor mirror wafers according to claim 2, wherein a polishing stock removal in the double side primary mirror polishing is at least 60 $\mu$m.

5. A method of manufacturing semiconductor mirror wafers according to claim 1, wherein a polishing pad used in the double side primary mirror polishing has Asker C-scale hardness of at least 80.

6. A method of manufacturing semiconductor mirror wafers according to claim 2, wherein a polishing pad used in the double side primary mirror polishing has Asker C-scale hardness of at least 80.

7. A method of manufacturing semiconductor mirror wafers according to claim 3, wherein a polishing pad used in the double side primary mirror polishing has Asker C-scale hardness of at least 80.

8. A method of manufacturing semiconductor mirror wafers according to claim 4, wherein a polishing pad used in the double side primary mirror polishing has Asker C-scale hardness of at least 80.

* * * * *